(12) United States Patent
Raghavan

(10) Patent No.: US 7,995,397 B1
(45) Date of Patent: Aug. 9, 2011

(54) POWER SUPPLY TRACKING SINGLE ENDED SENSING SCHEME FOR SONOS MEMORIES

(75) Inventor: Vijay Kumar Srinivasa Raghavan, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 117 days.

(21) Appl. No.: 12/151,282

(22) Filed: May 5, 2008

Related U.S. Application Data

(60) Provisional application No. 60/927,316, filed on May 3, 2007.

(51) Int. Cl.
*G11C 16/06* (2006.01)
(52) U.S. Cl. ............ 365/185.21; 365/185.17; 365/185.2
(58) Field of Classification Search ............. 365/185.17, 365/185.2, 185.21
See application file for complete search history.

(56) References Cited

U.S. PATENT DOCUMENTS

| | | | | |
|---|---|---|---|---|
| 5,422,854 A * | 6/1995 | Hirano et al. | ............... | 365/210.1 |
| 5,773,997 A * | 6/1998 | Stiegler | ............................ | 327/53 |
| 6,363,015 B1 * | 3/2002 | Barcella et al. | ........... | 365/185.21 |
| 6,424,571 B1 * | 7/2002 | Pekny | ........................ | 365/185.21 |
| 7,099,200 B2 * | 8/2006 | Sakui | ........................ | 365/185.33 |
| 2002/0021605 A1 * | 2/2002 | Harada et al. | .................. | 365/201 |
| 2003/0095448 A1 * | 5/2003 | Ichige et al. | .................. | 365/200 |
| 2005/0213387 A1 * | 9/2005 | Kubo et al. | ............... | 365/185.21 |
| 2006/0133171 A1 * | 6/2006 | Tonda | ............................ | 365/210 |
| 2007/0019469 A1 * | 1/2007 | Motoki | ..................... | 365/185.03 |

* cited by examiner

*Primary Examiner* — Hoai V Ho

(57) ABSTRACT

A SONOS memory sensing scheme includes a reference current circuit that tracks the changes in the power supply (Vcc). An equalizer of the current sense amplifier is coupled between the read out current line and the reference current line. The current sense amplifier includes data and datab (data bar) outputs which have a common mode noise due to variations in the power supply voltage. The data output is a current generated from the memory cell, and the datab output is generated by the current reference circuit.

19 Claims, 1 Drawing Sheet

POWER SUPPLY TRACKING SINGLE ENDED SENSING SCHEME FOR SONOS MEMORIES

RELATED APPLICATIONS

The present invention claims priority on provisional patent application Ser. No. 60/927,316, filed on May 3, 2007, entitled "Power Supply Tracking Single Ended Sensing Scheme for SONOS Memories," and is hereby incorporated by reference in its entirety.

STATEMENT REGARDING FEDERALLY SPONSORED RESEARCH

Not Applicable

THE NAMES OF THE PARTIES TO A JOINT RESEARCH AGREEMENT

Not Applicable

REFERENCE TO A SEQUENCE LISTING, A TABLE, OR A COMPUTER PROGRAM LISTING

Not Applicable

BACKGROUND OF THE INVENTION

SONOS (Silicon Oxide Nitride Oxide Silicon) memories use single ended current sensing to reduce chip area. SONOS bi-gate memory cells include a pass transistor and a SONOS cell. The read current of the memory cell is modulated by VCC significantly (up to, for example, 8 uA/V) due to the pass transistor's VCC dependence. This causes read failures due to significant degradation of sense margin. A conventional solution uses a double ended sensing scheme to track VCC dependence. Since there is no reference current involved and the current modulation due to pass transistors is a common mode signal for the bitline and the bitline-bar side, the VCC modulation effect on the final read speed and sense margin is removed. Unfortunately, these sort of differential read schemes involve two cells per bit of storage leading to poor area efficiency.

Another conventional solution uses a single ended sensing scheme with a pair of dummy column memory cells (one column for program cells and one column for erase cells) for every block of the array to obtain a reference current. The currents from the dummy columns of memory cells when added together can be mirrored to supply a reference cell current that is the center of program and erase current. Since the VCC modulation due to the pass transistor is common mode for the dummy columns of memory cells and the cell being accessed, the final read speed and sense margin were unaffected by pass transistor VCC modulation. Unfortunately, single ended sensing schemes that use a pair of dummy column cells to generate a reference current are less efficient in terms of chip area than a single ended sensing scheme that does not use dummy column of cells Non-volatile memories that use single ended sensing schemes need a current sensing scheme that automatically tracks the VCC modulation of the memory cell to achieve better sense margin and high speed sensing.

BRIEF SUMMARY OF INVENTION

A SONOS memory sensing scheme includes a reference current circuit that tracks the changes in the power supply (Vcc). An equalizer of the current sense amplifier is coupled between the read out current line and the reference current line. The current sense amplifier includes data and datab (data bar) outputs which have common mode noise due to variations in the power supply voltage. The data output is a current generated from the memory cell, and the datab output is generated by the current reference circuit.

DETAILED DESCRIPTION OF THE INVENTION

Figure 1:
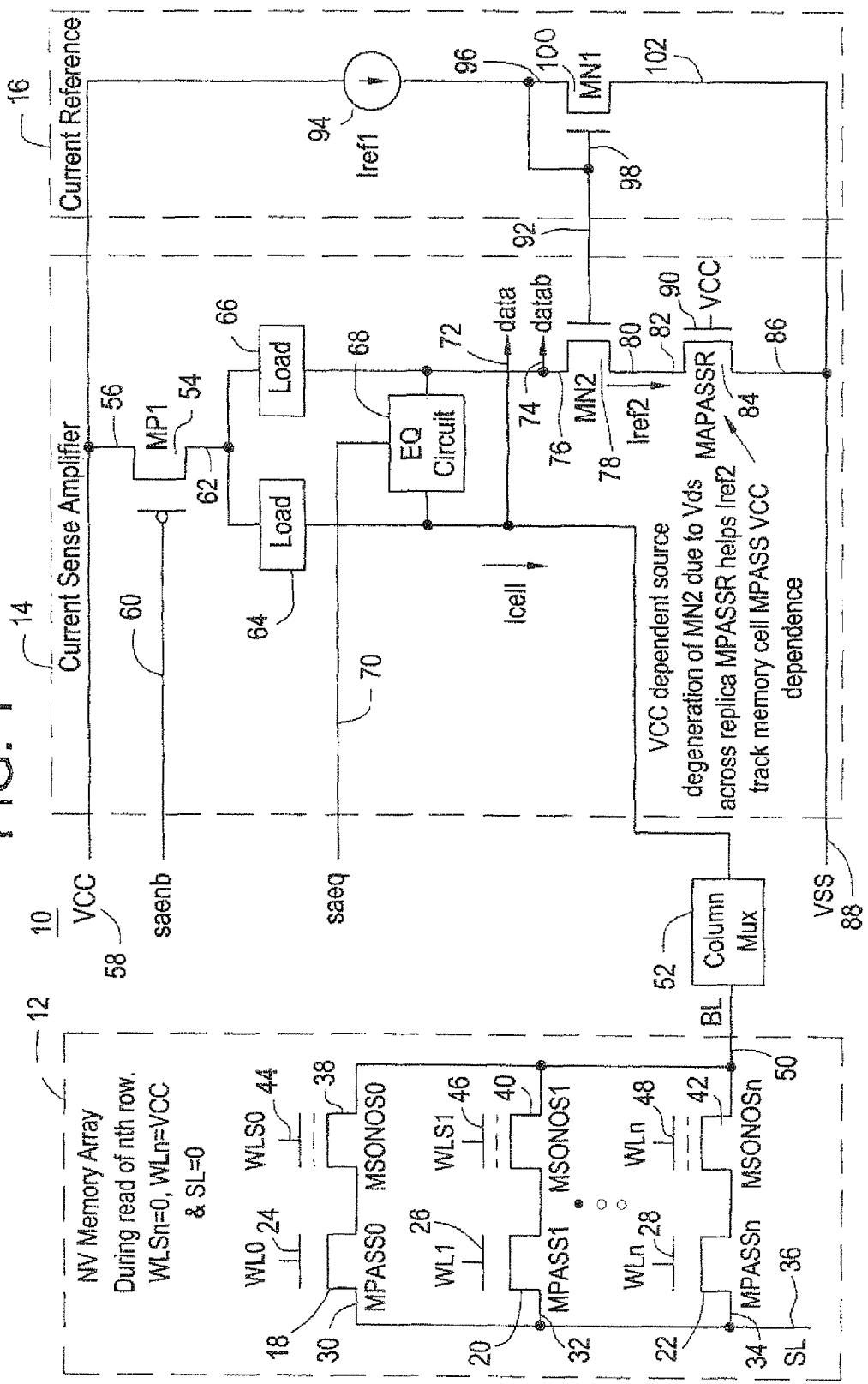
FIG. 1 is a circuit diagram of a SONOS memory sensing scheme in accordance with one embodiment of the invention.

The present invention is directed to a SONOS memory sensing scheme that has a reference current circuit that tracks the changes in the power supply (Vcc). An equalizer of the current sense amplifier is coupled between the read out current line and the reference current line. The current sense amplifier includes data and datab (data bar) outputs which contain the common mode noise due to variations in the power supply voltage. The data output is a current generated from the memory cell, and the datab output is generated by the current reference circuit.

FIG. 1 is a circuit diagram of a SONOS memory sensing scheme 10 in accordance with one embodiment of the invention. The sensing scheme 10 has three main elements: a non-volatile (NV) memory array 12; a current sense amplifier 14; and a current reference circuit 16. The NV memory array 12 includes any suitable number of columns of memory cells, of which only a portion of one column is shown for purposes of illustration and not limitation. The NV memory array 12 shows a column of pass transistors 18, 20, 22, which are labeled, MPASS0, MPASS1, MPASSn (where n can be any suitable number). The gates 24, 26, 28 of the pass transistors 18, 20, 22 are coupled to the word lines WL0, WL1, WLn, respectively. The drains 30, 32, 34 of the pass transistors 18, 20, 22 are coupled to the sense line (SL) 36. The sources of the pass transistors 18, 20, 22 are coupled to the drains of the SONOS transistors 38, 40, 42. The SONOS transistors 38, 40, 42 are labeled MSONOS1, MSONOS2, MSONOSn. The gates 44, 46, 48 of the SONOS transistors 38, 40, 42 are coupled to SONOS word lines, WLS0, WLS1, WLSn, respectively. The sources of the SONOS transistors 38, 40, 42 are coupled to the bit line (BL). A column multiplexer 52 couples the bit line 50 to the current sense amplifier 14, although the column multiplexer 52 is capable of coupling one of a plurality of bit lines in the NV memory array 12 to the current sense amplifier 14.

The current sense amplifier 14 includes PMOS transistor (MP1) 54 with a source 56 coupled to the power supply voltage (Vcc) 58. The gate 60 of transistor 54 is coupled to an enable signal (saenb). The drain 62 of transistor 54 is coupled to the first nodes of a pair of loads 64, 66. An equalization circuit 68 is coupled between the second nodes of the loads 64, 66. The equalization circuit 68 is controlled by an enable signal (saeq) 70. The load 64 is coupled to the data output line 72 and to the column multiplexer 52, and the current from the memory cell (Icell) is carried by this conductor. The load 66 is coupled to the datab output line 74 and to the drain 76 of NMOS transistor (MN2) 78. The source 80 of transistor 78 forms the signal Iref2 and is coupled to the drain 82 of NMOS transistor (MPASSR) 84. The source 86 of transistor 84 is coupled to the low voltage of the power supply (VSS) 88. The gate 90 of transistor 84 is coupled to the high voltage of the power supply (VCC) 58. The gate 92, labeled nbias, of transistor 78 is coupled to the current reference circuit 16.

The current reference circuit 16 includes a current source (Iref) 94 coupled to the power supply voltage 58. The output of the current source 94 is coupled to the drain 96 and gate 98 of NMOS transistor (MN1) 100. The source 102 of transistor 100 is coupled to the low voltage of the power supply (VSS) 88. Thus, the current reference circuit 16 is configured to create a suitable bias at the gate 98 of transistor MN1 100 for a given reference current (Iref1).

The current sense amplifier 14 shown in FIG. 1 takes in the current (Icell) from the NV memory array 12 and compares it to the reference current (Iref2) and outputs a differential voltage output voltage (data-datab) which can be further amplified by downstream voltage amplifiers. When the input saenb 60 is low, it turns on the current sense amplifier 14 by turning ON transistor MP1 54. Input saeq 70 comprises an enable to the equalization circuit 68 to help precharge and equilibrate the differential nodes prior to turn ON of the current sense amplifier 14. The loads 64, 66 serve as the loading devices for the current sense amplifier 14. The loads 64, 66 can be designed using, for example, diode connected devices, resistors, current mirror loads, biased transistors, or the like. Transistor MN2 78 comprises a mirror of transistor MN1 100, but with its source degenerated by the Vds drop of transistor MPASSR 84. Transistor MPASSR 84 comprises a replica of the PASS transistors 18, 20, 22 in the NV memory array 12 which sees a power supply bias on its gate during a read operation.

For purposes of illustration and not limitation, during a read operation row0 is selected by taking WL0=VCC, SL=0 and WLS0=0. The column multiplexer 52 is turned ON by a column address. This causes the current Icell to flow through the bitlines, colmux and the sense amplifier loads to VCC. Since WL=VCC, the current Icell is modulated by a change in the power supply voltage VCC. In the reference side, the Iref1 current is set by the current source 94 to give a bias that will create a current that is, for example, approximately 0.5*(Iers+ Iprg), where Iers is the worst case erase current and Iprg is the worst case program current. Gate 92 of transistor MN2 78 gets this bias voltage set at the gate 98 of transistor MN1 100, but also has its source degenerated by a replica PASS transistor MPASSR 84. The Vds drop across MPASSR 84 degenerates the source 80 of transistor MN2 78 such that Iref2 is also modulated due to power supply variation, and, thus, tracks the cell current modulation. Since the current is affected on both sides of the amplifier, this becomes common mode and results in very good sense margin and read speeds across power supply variations.

The new amplifier according to exemplary embodiments of the present invention achieves robust and accurate power supply tracking through the use of a replica PASS transistor 84 in the current sense amplifier 14. The present new sense read scheme is area efficient, because it does not use an entire column of dummy cells. In addition, the new scheme achieves good sense margin and read speeds even for wide variation of power supply voltage.

Exemplary embodiments of the present invention can be used in conjunction with any suitable type of memory, such as, for example, non-volatile SONOS memory technologies or products, or other like memories. Each of elements of the circuit 10 can be comprised of any suitable type of electrical or electronic circuit, component or device that is capable of performing the functions associated with the respective element. For example, each of the transistors illustrated in FIG. 1 can be comprised of any suitable type of transistor or other like device.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A sensing apparatus for Silicon-Oxide-Nitride-Oxide-Silicon ("SONOS") memories, comprising:
    a single-ended current sense amplifier;
    a column multiplexer coupled to a first input of the current sense amplifier and to a memory array;
    a current reference circuit coupled to a second input of the current sense amplifier; and
    a replica pass transistor coupled to the second input of the current sense amplifier.

2. The apparatus of claim 1, wherein the current sense amplifier comprises a first load coupled to the column multiplexer and a second load in parallel with the first load coupled to the current reference circuit.

3. The apparatus of claim 2, wherein the second load is coupled through a minor transistor to the replica pass transistor.

4. The apparatus of claim 3, wherein the memory array includes a bitline output coupled to the column multiplexer.

5. The apparatus of claim 4, wherein the memory array comprises a pass transistor in series with a SONOS transistor.

6. The apparatus of claim 2, further including an equalizer circuit coupled between the first load and the second load.

7. A sensing apparatus for Silicon-Oxide-Nitride-Oxide-Silicon ("SONOS") memories, comprising:
    a non-volatile memory having a bitline as an output;
    a single-ended current sense amplifier having a first input receiving the output of the bitline and having data and datab outputs;
    a current reference circuit having an output transmitted to a second input of the current sense amplifier; and
    a replica pass transistor coupled to the second input of the current sense amplifier.

8. The sensing apparatus of claim 7, wherein the current sense amplifier comprises a first load and a second load in parallel.

9. The sensing apparatus of claim 8, wherein the first load is electronically coupled to the output of the bitline.

10. The sensing apparatus of claim 8, wherein a node of the first load forms the data output.

11. The sensing apparatus of claim 8, wherein a node of the second load forms the datab output.

12. The sensing apparatus of claim 8, further comprising an equalizer circuit electrically coupled between the first load and the second load.

13. The sensing apparatus of claim 12, wherein the second load is coupled through a mirror transistor to the replica pass transistor.

14. The sensing apparatus of claim 13, wherein the memory array comprises a pass transistor in series with a SONOS transistor.

15. The sensing apparatus of claim 14, including a column multiplex coupled between the memory array and the first input of the current sense amplifier.

16. A sensing apparatus for Silicon-Oxide-Nitride-Oxide-Silicon ("SONOS") memories, comprising:
    a non-volatile memory having a single column of SONOS transistors coupled to a bitline;
    a single-ended current sense amplifier having a first input receiving an output of the bitline and having data and datab outputs;

a current reference circuit having an output transmitted to a second input of the current sense amplifier; and a replica pass transistor coupled to the second input of the current sense amplifier.

17. The sensing apparatus of claim 16, wherein the current sense amplifier comprises a first load coupled to a column multiplexer and a second load in parallel with the first load coupled to the current reference circuit.

18. The sensing apparatus of claim 17, wherein the second load is coupled through a mirror transistor to the replica pass transistor.

19. The sensing apparatus of claim 18, wherein the column multiplexer is coupled between the memory array and the first input of the current sense amplifier.

* * * * *